US008518491B2

(12) United States Patent
Garces et al.

(10) Patent No.: US 8,518,491 B2
(45) Date of Patent: Aug. 27, 2013

(54) PREPARATION OF EPITAXIAL GRAPHENE SURFACES FOR ATOMIC LAYER DEPOSITION OF DIELECTRICS

(75) Inventors: Nelson Garces, Alexandria, VA (US); Virginia D. Wheeler, Alexandria, VA (US); David Kurt Gaskill, Alexandria, VA (US); Charles R. Eddy, Jr., Columbia, MD (US); Glenn G. Jernigan, Waldorf, MD (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 12 days.

(21) Appl. No.: 13/182,494

(22) Filed: Jul. 14, 2011

(65) Prior Publication Data

US 2013/0017323 A1   Jan. 17, 2013

(51) Int. Cl.
    *C23C 16/00*   (2006.01)
(52) U.S. Cl.
    USPC ............... 427/307; 427/248.1; 427/299
(58) Field of Classification Search
    None
    See application file for complete search history.

(56) References Cited

U.S. PATENT DOCUMENTS

2010/0154835 A1* 6/2010 Dimeo et al. ............... 134/31

FOREIGN PATENT DOCUMENTS

WO   WO2009/132165   * 10/2009

OTHER PUBLICATIONS

D.B. Farmer, R.G. Gordon, "Atomic Layer Deposition on Suspended Single-Walled Carbon Nanotubes via Gas-Phase Noncovalent Functionalization," Nano Lett. 6, 699 (2006).
Adam Pirkle, Robert M. Wallace, Luigi Colombo, "In situ studies of Al2O3 and HfO2 dielectrics on graphite," Appl. Phys. Lett. vol. 95, 133106 (2009).
Damon B. Farmer, Hsin-Ying Chiu, Yu-Ming Lin, Keith A. Jenkins, Fengnian Xia, Phaedon Avouris, "Utilization of a Buffered Dielectric to Achieve High Field-Effect Carrier Mobility in Graphene Transistors," Nano Letters, vol. 9, No. 12, 4474-4478 (2009).
Joshua A. Robinson, Michael Labella III, Kathleen A. Trumbull, Xiaojun Weng, Randall Cavelero, Tad Daniels, Zachary Hughes, Mathew Hollander, Mark Fanton, David Snyder, "Epitaxial Graphene Materials Integration: Effects of Dielectric Overlayers on Structural and Electronic Properties," ACSNano. vol. 4, No. 5, pp. 2667-2672 (2010).
Yu-Ming Lin, Keith A. Jenkins, Alberto Valdes-Garcia, Joshua P. Small, Damon B. Farmer, Phaedon Avouris, "Operation of Graphene Transistors at Gigahertz Frequencies," Nano Letters, vol. 9, No. 1, 422-426 (2009).
Seyoung Kim, Junghyo Nah, Insun Jo, Davood Shahrjerdi, Luigi Colombo, Zhen Yao, Emanuel Tutuc, Sanjay K. Banerjee, "Realization of high mobility dual-gated graphene field-effect transistor with Al2O3 dielectric," Appl. Phys. Lett., vol. 94, 062107 (2009).

(Continued)

*Primary Examiner* — Joseph Miller, Jr.
(74) *Attorney, Agent, or Firm* — Amy Ressing; Joslyn Barritt

(57) ABSTRACT

Processes for preparation of an epitaxial graphene surface to make it suitable for deposition of high-κ oxide-based dielectric compounds such as $Al_2O_3$, $HfO_2$, $TaO_5$, or $TiO_2$ are provided. A first process combines ex situ wet chemistry conditioning of an epitaxially grown graphene sample with an in situ pulsing sequence in the ALD reactor. A second process combines ex situ dry chemistry conditioning of the epitaxially grown graphene sample with the in situ pulsing sequence.

12 Claims, 14 Drawing Sheets

Dry chemical treatment

(56) References Cited

OTHER PUBLICATIONS

B. Lee, G. Mordi, T.J. Park, L. Goux, Y.J. Chabal, K.J. Cho, E.M. Vogel, M.J. Kim, L. Colombo, R.M. Wallace, J. Kim, "Atomic-Layer-Deposited Al2O3 as Gate Dielectrics for Graphene-Based Devices," ECS Transactions, 19(5), 225-230 (2009).

Bongki Lee, Seong-Yong Park, Hyun-Chul Kim, Kyeongjae Cho, Eric M. Vogel, Moon J. Kim, Robert M. Wallace, and Jiyoung Kim, "Conformal Al2O3 dielectric layer deposited by atomic layer deposition for graphene-based nanoelectronics." Appl. Phys. Lett. 92, 203102 (2008).

Xinran Wang, Scott M. Tabakman and Hongjie Dai. "Atomic Layer Deposition of Metal Oxides on Pristine and Functionalized Graphene." J. Am. Chem. Soc., 130 (26), (2008), pp. 8152-8153.

T. Shen, J.J. Gu, M. Xu, Y.Q. Wu, M.L. Bolen, M.A. Capano, L.W. Engel, and P.D. Ye, "Observation of quantum-Hall effect in gated epitaxial graphene grown on SiC (0001)." APL 95, 172105 (2009).

S. Banerjee, T. Hemraj-Benny, and S.S. Wong. "Covalent surface chemistry of single-walled carbon nanotubes," Adv. Mater. 17(1) (2005) pp. 17-29.

J.C. Sarace, R.E. Kerwin, D.L. Klein, R. Edwards, Metal-Nitride-Oxide-Silicon Field-Effect Transistors, With Self-Aligned Gates, Sol. State Elec. 11 (1968) 653-660.

Uttam Singisetti, Mark A. Wistey, Gregory J. Burek, Erdem Arkun, Ashish K. Baraskar, Yanning Sun, Edward W. Kiewra, Brian J. Thibeault, Arthur C. Gossard, Chris J. Palmstrøm, and Mark J. W. Rodwell, "InGaAs channel MOSFET with self-aligned source/drain MBE regrowth technology," Phys. Status Solidi C 6, No. 6,1394-1398 (2009) / DOI 10.1002/pssc.200881532.

L.O. Nyakiti, V.D. Wheeler, N.Y. Garces, R.L. Myers-Ward, C.R. Eddy Jr., and D.K. Gaskill, "Enabling graphene-based technologies: Toward wafer-scale production of epitaxial graphene," MRS Bulletin, vol. 37, pp. 1149-1157 (2012).

Xinran Wang, Scott M. Tabakman, and Hongjie Dai, "Atomic layer deposition of metal oxides on pristine and functionalized graphene," Journal of the American Chemical Society, 130(26): p. 8152 (2008).

Florian Speck, Markus Ostler, Jonas Rohrl, Konstantin V. Emtsev, Martin Hundhausen, Lothar Ley, and Thomas Seyller, "Atomic layer deposited aluminum oxide films on graphite and graphene studied by XPS and AFM," Physica Status Solidi C: Current Topics in Solid State Physics, vol. 7, No. 2, pp. 398-401 (2010).

Virginia Wheeler, Nelson Garces, Luke Nyakiti, Rachael Myers-Ward, Glenn Jernigan, James Culbertson, Charles Eddy Jr., D. Kurt Gaskill, "Fluorine functionalization of epitaxial graphene for uniform deposition of high-K dielectrics," Carbon, 50 (2012) 2307-2314.

\* cited by examiner

PREPARATION OF EPITAXIAL GRAPHENE SURFACES FOR ATOMIC LAYER DEPOSITION OF DIELECTRICS

TECHNICAL FIELD

The present invention relates to preparation of graphene surfaces prior to atomic layer deposition of dielectrics such as aluminum oxide or hafnium oxide.

BACKGROUND

Graphene is a monolayer of conjugated $sp^2$ bonded carbon atoms tightly packed into a two-dimensional (2D) hexagonal lattice. Small quantities of high quality monolayer graphene can be obtained by mechanical exfoliation of highly oriented pyrolytic graphite (HOPG), whereas large area epitaxial graphene (EG) is grown by Si sublimation of SiC. The morphology of the EG is primarily determined by the step bunching occurring in the SiC during sublimation.

Graphene is considered to be an outstanding candidate for nanoelectronic devices due to its exceptional electronic and physical properties, including its high intrinsic carrier (electron and hole) mobility and thermal conductivity. The high carrier mobility exhibited by graphene, when combined with the integration of high-κ, i.e., highly insulating, films acting as gate dielectrics in field-effect transistors (FETs), enables operation of such devices at the very high frequencies needed for RF, low power analog communications and enables such devices to overcome the limitations of the current CMOS Si-based digital logic in new device concepts.

High-κ dielectrics such as aluminum oxide ($Al_2O_3$), hafnium oxide ($HfO_2$), tantalum oxide ($Ta_2O_5$), and titanium oxide ($TiO_2$), etc., are important for the realization of graphene-based top-gated electronic devices such as high electron mobility transistors (HEMTs), FETs, new logic device concepts, etc. The implementation of high-k dielectrics on graphene is expected to improve the channel mobility in such devices by screening charged impurities and reducing the high leakage currents observed in traditional silicon dioxide ($SiO_2$) gated oxides. In addition, these graphene-based electronic devices are envisioned to manifest dimensions less than 100 nm, and use of high-κ dielectrics to help meet these scaling challenges are essential in the domain of future graphene applications.

Such high-κ gate dielectrics on graphene are envisioned to comprise very thin layers having a thickness on the order of about 2-50 nm, with minimal trapped and mobile charge which would deleteriously affect device performance. Several different approaches have been attempted to create a functionalized layer on the graphene surface for uniform, conformal dielectric deposition. However, because of the $sp^2$ bond configuration of graphene, the surface lacks the hydroxyl sites or ALD reaction sites needed for successful deposition, and none of the current approaches have successfully provided a functionalized graphene surface suitable for conformal deposition of a high-κ dielectric.

For example, pretreatment using $O_3$ or $NO_2$ pretreatment such as that described in D. B. Farmer, R. G. Gordon, "Atomic Layer Deposition on Suspended Single-Walled Carbon Nanotubes via Gas-Phase Noncovalent Functionalization," Nano Lett. 6, 699 (2006) can lead to broken bonds on the graphene sheet, or introduce charged impurities, and thus does not provide an optimal surface for dielectric deposition.

Another technique uses electron beam evaporation of metal Al and Hf followed by an oxidation step. Adam Pirkle, Robert M. Wallace, Luigi Colombo, "In situ studies of $Al_2O_3$ and $HfO_2$ dielectrics on graphite," Appl. Phys. Lett. Vol. 95, 133106 (2009) describe a process in which 1 nm of Al or Hf metal is evaporated directly on the exfoliated graphene surface to create a metallic seeding layer which is subsequently oxidized with dry $O_2$ to form the first layer(s) of the dielectric to be deposited. Deposition on 200° C. annealed graphene surfaces was shown to significantly affect the subsequent oxidation and film composition, indicating surface preparation greatly influences successful deposition of ALD films. The Al seeding layer also produced non-uniform clusters ($\leq 10$ nm) on the graphene surface, which can limit the scalability of $Al_2O_3$. Use of an $HfO_2$ nucleation layer resulted in covalent bonding with graphene, suggesting a degradation in electronic structure that will limit device performance.

Another approach uses a buffered dielectric seeding polymer prior to ALD deposition. Damon B. Farmer, Hsin-Ying Chiu, Yu-Ming Lin, Keith A. Jenkins, Fengnian Xia, Phaedon Avouris, "Utilization of a Buffered Dielectric to Achieve High Field-Effect Carrier Mobility in Graphene Transistors," Nano Letters, Vol. 9, No. 12, 4474-4478 (2009) describes the usage of a 10 nm low-κ dielectric polymer spin-coated directly on the graphene surface prior to depositing $HfO_2$ via ALD. This process seems quite successful in terms of surface coverage of the oxide layer, and does not significantly degrade carrier mobility in the graphene layer, thus allowing high field-effect mobilities in the gated structures. One disadvantage of this approach is the complexity involved, including depositing the polymer with proper spinning speeds and polymer dilution rates that will ultimately control the buffered layer thickness. Improper deposition of the polymer will introduce impurities that serve as scattering centers, thus reducing mobility. Moreover, the low-κ polymer under the gate is not always beneficial in device applications and could inhibit ultimate scaling. Such factors dictate that a high level of expertise is needed to accomplish a successful deposition. In addition, the polymer described in Farmer is not readily available, further making this process unsuitable for large-scale production.

Other techniques have also been described.

Joshua A. Robinson, Michael LaBella III, Kathleen A. Trumbull, Xiaojun Weng, Randall Cavelero, Tad Daniels, Zachary Hughes, Mathew Hollander, Mark Fanton, David Snyder, "Epitaxial Graphene Materials Integration: Effects of Dielectric Overlayers on Structural and Electronic Properties," ACSNano. Vol. 4, No. 5, pp. 2667-2672 (2010) discusses ALD of various high-κ dielectrics on epitaxial graphene using a nucleation layer consisting of 2-5 nm of metallic Al, Hf, Ti, or Ta, which when fully oxidized in atmosphere produces a uniform seeding film. ALD was initiated by 10 water pulses to further oxide the metallic layer. Their experiments covered a range of deposition temperatures from 80-300° C. Film coverage and uniformity was found to improve with increased temperatures, but only $TiO_2$ resulted in a conformal and continuous film with good morphology and little effect on the underlying graphene mobility.

Yu-Ming Ling, Keith A. Jenkins, Alberto Valdes-Garcia, Joshua P. Small, Damon B. Farmer, Phaedon Avouris, "Operation of Graphene Transistors at Gigahertz Frequencies," Nano Letters, Vol. 9, No. 1, 422-426 (2009) describes fabricating exfoliated graphene on a highly resistive Si substrate with a 300 nm $SiO_2$ layer to form a top-gated transistor. A functionalization layer consisting of 50 ALD cycles of $NO_2$-TMA was deposited on the graphene layer prior to deposition of a 12-nm $Al_2O_3$ layer and was used to promote a gate dielectric without pinholes. These devices showed ideal 1/f frequency dependence, characteristic of FET-like behavior, but both device conductance and field-effect mobilities were reduced after ALD deposition. This suggests that terahertz graphene devices could be realized with the proper gate dielectric deposition which preserves graphene's high mobility.

Seyoung Kim, Junghyo Nah, Insun Jo, Davood Shahrjerdi, Luigi Colombo, Zhen Yao, Emanuel Tutuc, Sanjay K. Banerjee, "Realization of high mobility dual-gated graphene field-effect transistor with $Al_2O_3$ dielectric," *Appl. Phys. Lett.*, Vol. 94, 062107 (2009) describes a study showing that a dual-gated graphene FET could be achieved using exfoliated graphene and an $Al_2O_3$ top-gate dielectric deposited by ALD. A 1-2 nm metallic Al layer was deposited by e-beam evaporation was used as a nucleation layer for the 15 nm $Al_2O_3$ film. ALD growth was started with an $H_2O$ oxidizing cycle at elevated temperatures to complete the metal oxidation. While this process resulted in preservation of high mobilities, the oxide dielectric constant was low indicating improvements in oxide deposition are needed.

B. Lee, G. Mordi, T. J. Park, L. Goux, Y. J. Chabal, K. J. Cho, E. M. Vogel, M. J. Kim, L. Colombo, R. M. Wallace, J. Kim, "Atomic-Layer-Deposited $Al_2O_3$ as Gate Dielectrics for Graphene-Based Devices," *ECS Transactions*, 19(5), 225-230 (2009) shows that a 10 s ozone (22 wt %) pretreatment of HOPG followed by <10 nm of $Al_2O_3$ via ALD resulted in a conformal and uniform oxide film. With normal water precursors, deposition was only achieved on step edges, while ozone-incorporated deposition allows growth on otherwise inert basal plane of graphene. In addition, Raman showed little to no defect population with this technique and C—V measurements yielded a dielectric constant of ~9. However, there is a still large amount of leakage current in these devices, suggesting that there is non-uniform film or graphene/oxide interface imperfections.

Bongki Lee, Seong-Yong Park, Hyun-Chul Kim, Kyeong-Jae Cho, Eric M. Vogel, Moon J. Kim, Robert M. Wallace, and Jiyoung Kim, "Conformal Al2O3 dielectric layer deposited by atomic layer deposition for graphene-based nanoelectronics." *Appl. Phys. Lett.* 92, 203102 (2008) describes the use of ozone as the ALD oxygen precursor in $Al_2O_3$ deposition on HOPG. It was found that an ozone pretreatment could act as an initiation for uniform oxide deposition. The thickness shown to be conformal was ~9.5 nm suggesting it is possible to deposit thinner dielectrics on graphene. However, the step height of HOPG is an order of magnitude smaller than epitaxial graphene which could inhibit the use of extremely thin oxides.

Xinran Wang, Scott M. Tabakman and Hongjie Dai. "Atomic Layer Deposition of Metal Oxides on Pristine and Functionalized Graphene." *J. Am. Chem. Soc.*, 130 (26), (2008), pp. 8152-8153, shows that ALD of metal oxides gives no direct deposition on defect-free pristine exfoliated graphene. However, defect sites and edges are easily decorated with oxide growth. These results indicate the need for functionalization of graphene is needed in order to induce uniform surface groups as active nucleation sites for ALD. Soaking the graphene in PTCA solution for 30 min. rendered the surface necessary for ALD deposition. However, this was only studied over a few microns, and no electrical characterization was done to determine the effect of PTCA on the underlying graphene properties.

T. Shen, J. J. Gu, M. Xu, Y. Q. Wu, M. L. Bolen, M. A. Capano, L. W. Engel, and P. D. Ye, "Observation of quantum-Hall effect in gated epitaxial graphene grown on SiC (0001)." APL 95, 172105 (2009) discusses the effect of a 1 nm metallic nucleation layer prior to dielectric deposition via ALD on the electrical properties of epitaxial graphene. After metallic oxidation, 30 nm $Al_2O_3$ films were deposited at 300° C., which resulted in films that showed no significant Hall mobility degradation. These films also showed QHE and SdH oscillations again leading to the viability of graphene devices. No information on morphology was provided.

S. Banerjee, T. Hemraj-Benny, and S. S. Wong. "Covalent surface chemistry of single-walled carbon nanotubes," *Adv. Mater.* 17(1) (2005) pp. 17-29, discusses the chemical functionalization of carbon nanotubes to tailor the electronic and mechanical properties for unique purposes. Several functionalizations were explored including fluorination and ozonolysis. This suggests that similar functionalization could be possible on 2D graphene sheets to yield a more reactive surface for successful ALD oxide deposition.

Thus, as can be seen from the literature, drawbacks of the prior processes include their complex and time-consuming nature, high cost, utilization of materials that are not readily available, and/or production of a coated graphene that is less electrically desirable because of damage to the graphene or the nature of the dielectric material used.

SUMMARY

This summary is intended to introduce, in simplified form, a selection of concepts that are further described in the Detailed Description. This summary is not intended to identify key or essential features of the claimed subject matter, nor is it intended to be used as an aid in determining the scope of the claimed subject matter. Instead, it is merely presented as a brief overview of the subject matter described and claimed herein.

The present invention provides processes for preparation of an epitaxial graphene surface to make it suitable for deposition of high-κ oxide-based dielectric compounds such as $Al_2O_3$, $HfO_2$, $TaO_5$, $TiO_2$, etc.

A first process in accordance with the present invention combines ex situ wet chemistry conditioning of an epitaxially grown graphene sample (EG sample) with an in situ pulsing sequence in the ALD reactor. A second process combines ex situ dry chemistry conditioning of the EG sample with the in situ pulsing sequence.

In the wet chemistry process in accordance with the present invention, an EG sample is first immersed in a solution comprising, for example, a mixture of hydrofluoric acid (HF) and deionized water (DI) for several seconds. The sample is then removed from the HF:DI solution and soaked and/or rinsed in DI for several seconds. After rinsing, the sample is placed in a warm SC1 ($NH_4OH:H_2O_2$:DI) solution for several minutes, removed from the SC1 solution and rinsed and/or soaked in DI water for several seconds, and dried in $N_2$ to complete the wet chemistry conditioning. The thus-prepared EG sample is then placed into the ALD reactor for in situ completion of the surface preparation. This in situ seeding/surface preparation is accomplished with either an initial trimethylaluminum (TMA) pulse or by a series of initial DI water pulses prescribed in the deposition recipe.

In the dry chemistry process in accordance with the present invention, an EG sample is exposed to an active gas, e.g., $XeF_2$, diluted with an inert gas such as argon to form $sp^3$-bonded carbon atoms on the EG surface. As with the sample prepared by wet conditions, the EG sample so prepared by dry conditioning is then placed into the ALD reactor for in situ completion of the surface preparation, and the in situ step is accomplished in the same manner for the dry-conditioned sample as for the wet-conditioned sample, i.e., the in situ seeding/surface preparation is accomplished with either an initial trimethylaluminum (TMA) pulse or by a series of initial DI water pulses prescribed in the deposition recipe.

In both cases, the prepared surface of the EG sample is suitable for atomic layer deposition (ALD) of a high-κ dielectric such as $Al_2O_3$, with the deposited dielectric forming a smooth, conformal layer on the surface of the sample.

DETAILED DESCRIPTION

The aspects and features of the present invention summarized above can be embodied in various forms. The following description shows, by way of illustration, combinations and configurations in which the aspects and features can be put into practice. It is understood that the described aspects, features, and/or embodiments are merely examples, and that one skilled in the art may utilize other aspects, features, and/or embodiments or make structural and functional modifications without departing from the scope of the present disclosure.

Direct deposition of dielectric oxides on pristine or non-functionalized graphene sheets using $H_2O$-based precursors is hindered by the highly hydrophobic and chemically inert nature of graphene. Growth attempts on exfoliated graphene have led to no direct deposition on defect-free pristine exfoliated graphene. On HOPG, as well as EG, ALD resulted in non-uniform coverage. On exfoliated graphene and HOPG, ALD results in selective growth at the step edges and defects, where broken dangling bonds are believed to serve as nucleation sites for deposition.

Figures 1A, 1B, 1C:
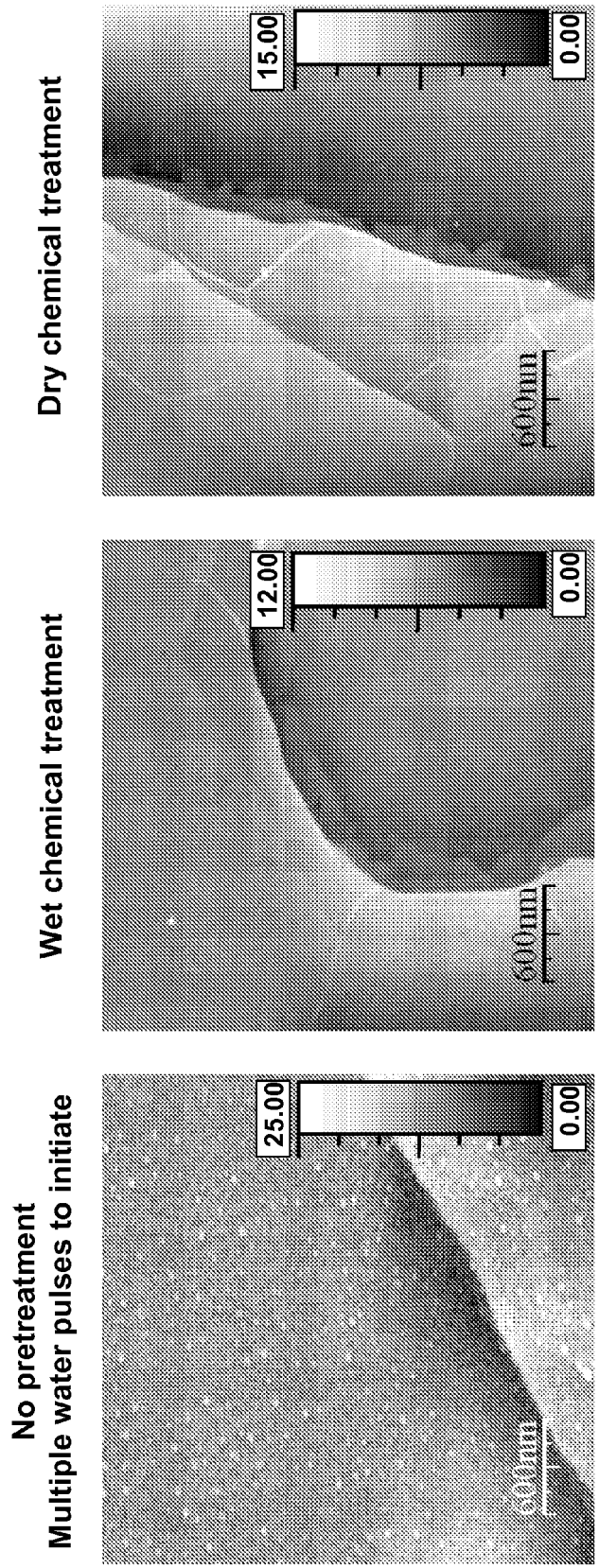
FIGS. 1A-1C illustrate the effects on the quality of $Al_2O_3$ coverage on graphene of the wet and dry chemistry surface pretreatments in accordance with the present invention.

For ALD on EG, although preferential nucleation on terraces has been reported, enhanced nucleation along step edges is problematic. The AFM image in FIG. 1A illustrates the results of direct ALD of $Al_2O_3$ on an EG sample. As can be seen from the image shown in FIG. 1A, attempting to directly deposit a dielectric on an EG sample results in incomplete coverage characterized by a spongy-like surface with multiple isolated particles.

The present invention solves this coverage problem and provides processes for preparation of an epitaxial graphene surface to make it suitable for deposition of high-κ oxide-based dielectric compounds such as $Al_2O_3$, $HfO_2$, $TaO_5$, $TiO_2$, etc.

A first process in accordance with the present invention combines ex situ wet chemistry conditioning of an epitaxially grown graphene sample (EG sample) with an in situ pulsing sequence in the ALD reactor. A second process combines ex situ dry chemistry conditioning of the EG sample with the in situ pulsing sequence.

In the wet chemistry process in accordance with the present invention, an EG sample is first immersed in a solution comprised of a mixture of hydrofluoric acid (HF) and deionized water (DI) for several seconds to remove any oxides and/or impurities present. The sample is then removed from the HF:DI solution and soaked and/or rinsed in DI for several seconds. After rinsing, the sample is placed in a warm SC1 ($NH_4OH:H_2O_2:DI$) solution for several minutes to promote the formation of an OH-terminated surface necessary for initial nucleation of ALD. The sample is then removed from the SC1 solution, rinsed and/or soaked in DI water for several seconds, and dried in $N_2$ to complete the wet chemistry conditioning. The thus-prepared EG sample is then placed into the ALD reactor for in situ completion of the surface preparation. This in situ seeding/surface preparation is accomplished with either an initial trimethylaluminum (TMA) pulse or by a series of initial DI water pulses prescribed in the deposition recipe.

In an exemplary embodiment of the dry chemistry process in accordance with the present invention, an EG sample is exposed to an active gas, e.g., $XeF_2$, diluted with an inert gas such as nitrogen or argon, to create C—F bonds on the surface of the EG sample which are necessary nucleation sites for ALD of oxides. As with the sample prepared by wet conditions, the EG sample so prepared by dry conditioning is then placed into the ALD reactor for in situ completion of the surface preparation, and the in situ step is accomplished in the same manner for the dry-conditioned sample as for the wet-conditioned sample, i.e., the in situ seeding/surface preparation is accomplished with either a single initial trimethylaluminum (TMA) pulse or by a series of initial DI water pulses prescribed in the deposition recipe.

In either case, as described below, the surface of the EG sample prepared in accordance with the present invention is suitable for the atomic layer deposition (ALD) of a high-κ dielectric such as $Al_2O_3$, with the deposited dielectric forming a smooth, conformal layer on the surface of the sample.

The advantages of pretreating the graphene surface in accordance with the present invention are illustrated in FIGS. 1B and 1C. FIG. 1B is an AFM of an $Al_2O_3$-coated EG sample that has been pretreated using a wet chemistry process in accordance with the present invention. FIG. 1C is an AFM of an $Al_2O_3$-coated EG sample that has been pretreated using a dry chemistry process in accordance with the present invention. As can readily be seen in FIGS. 1B and 1C the dielectric coating on the pretreated samples is conformal and highly uniform, with few pits or other irregularities on the surface.

Exemplary embodiments of graphene surface preparation using the wet and dry chemistry processes of the present invention and dielectric ALD on the prepared graphene will be described in more detail below.

In a first exemplary embodiment in accordance with the present invention, an EG sample can be prepared for ALD of a dielectric material such as $Al_2O_3$ by an ex situ wet chemistry treatment. Such a treatment in accordance with the present invention results in an EG surface terminated with O—H bonds which are necessary for ALD nucleation.

In accordance with this first exemplary embodiment, in a first step the EG sample is immersed in a solution comprising a mixture of 49% hydrofluoric acid (HF) and 18.2 MΩ DI water at a strong concentration, for instance 1:1 ratio. The use of such a high concentration HF solution acts to remove oxides or oxide compounds from the graphene surface. The EG sample is soaked in the solution for a short time, e.g., several seconds, though times can vary by +/− a few seconds. The sample is then removed from the HF:DI solution and soaked and/or rinsed in 18.2 MΩ DI water for several seconds. Other HF:DI ratios also can be used, with the soaking time being adjusted accordingly to range from a few seconds to a few minutes.

In a second step, the sample is placed in a warm Standard Clean 1 (SC1) ($NH_4OH:H_2O_2:DI$) solution for several minutes. The SC1 solution can have any suitable constituent ratios, e.g., (1:1:5) prepared from one part 30% ammonium hydroxide ($NH_4OH$), one part hydrogen peroxide ($H_2O_2$), and five parts of 18.2 MΩ DI water, though other ratios thereof may be used as appropriate. In an exemplary embodiment, the SC1 solution is at about 80° C.-110° C. and the soaking time is about 10 minutes. After soaking, the sample is removed from the SC1 solution and rinsed and/or soaked in 18.2 MΩ DI water for several seconds, and in a final step of the ex situ wet treatment, is blown dry, for example, in a nitrogen atmosphere.

Once the ex situ wet treatment of the EG sample as described above is completed, the sample goes into the ALD reactor for in-situ completion of surface preparation. The initiation sequence for ALD can be accomplished with either one initial TMA pulse or by 10-20 initial $H_2O$ pulses as prescribed in the deposition recipe. Whether the in situ surface treatment step is accomplished using one initial TMA pulse or a series of $H_2O$ pulses will depend on the thickness of the dielectric coating to be applied during ALD. In order to deposit very thin films (<30 nm), initiation with $H_2O$ pulses is required to provide additional reaction sites for deposition of the dielectric on the graphene surface (see FIGS. 4A and 4B, described in more detail below). In either case, this in situ step is important to promote uniform nucleation sites on the surface so that conformal ALD of the dielectric material can be achieved As noted above, in accordance with the present invention an EG sample can also be prepared for ALD of a dielectric material by means of an ex situ dry chemistry conditioning treatment, described below.

Thus, in another exemplary embodiment of a process for graphene surface treatment in accordance with the present invention, an EG sample can be dry treated ex situ by fluorinating the sample in an etcher using an active gas such as a fluorine gas diluted with an inert gas such as argon. In an exemplary case $XeF_2$ gas is used, where the partial pressure of the $XeF_2$ is near 0.8 Torr+/− a fraction of a Torr and the partial pressure of the carrier gas is near 35 Torr+/− a fraction of a Torr, though other pressures of both the active and the inert gases may be used as appropriate.

Such fluorination of the EG sample in accordance with the present invention creates C—F bonds on the EG surface which are necessary nucleation sites for ALD of oxides. This fluorination process can be done at or near room temperature, and can be done in either continuous mode or in pulse mode with each pulse lasting several seconds. In an exemplary case, the sample was treated using 6 pulses at 20 seconds each for a total dry chemistry treatment time of 120 seconds. By changing the pulse duration and/or the number of pulses, the fluorine concentration on the surface of the EG sample can be changed, which changes the concentration of C—F bonds on the surface as well.

Once the ex situ dry chemistry treatment step is completed, the treated sample goes into the ALD reactor for in-situ completion of surface preparation in the same manner as described above, i.e., with either one TMA pulse or a series of 10-20 $H_2O$ pulses to initiate the ALD process.

Thus, using either the wet or dry process in accordance with the present invention, the surface of the EG sample is modified and now has sufficient functional groups for conformal oxide deposition.

A layer of high-κ dielectric can then be applied to the prepared surface using any suitable ALD equipment and ALD process. For example, in exemplary implementations of ALD on a graphene surface prepared in accordance with the present invention, the inventors herein performed atomic layer deposition of $Al_2O_3$ on prepared epitaxial graphene using a commercially available Cambridge NanoTech Savannah 200 ALD System according to the recipe shown below. It will be noted that other ALD systems, processes, and recipes also may be used as appropriate within the scope and spirit of the present invention.

In ALD, sequences of alternating pulses of two different precursors with purging steps in between are sent to a reaction chamber. Each pulse is a half reaction consisting of one precursor and a cycle consists of complete sequence pulse 1+purging+pulse 2+purging. So roughly, a monolayer of material is obtained per growth cycle. One important feature of ALD is that each precursor does not react with itself or with the other precursor in the gas phase, thus preventing uncontrolled or parasitic growth of unknown species. Once the reactants are deposited on the sample surface and/or reactor walls, the unreacted precursor and byproducts are evacuated/purged.

In performing the ALD described herein, a wide range of deposition conditions were used by the inventors, including varying the temperatures from 150-300° C. and varying the number of cycles from 90-250. The carrier/purge gas for all depositions was $N_2$ at a constant flow of 20 sccm. Trimethylaluminum (TMA) was the aluminum precursor, whereas DI water was the oxygen precursor.

An example of the best deposition conditions obtained by the inventors using the equipment described above is outlined in the recipe below.

Sample temperature=225° C.
$N_2$=20 sccm: carrier gas flow
  1. DI Pulse=0.030 seconds
  2. Purge=20 seconds
  3. Repeat steps 1-2 10-20 times
  4. TMA Pulse=0.030 seconds
  5. Purge=20 seconds
  6. DI Pulse=0.030 seconds
  7. Purge=20 seconds
  8. Repeat steps 4-7 90-250 times The growth is initialized with a sequence of water pulses, typically 10-20, with 20 seconds purging time between pulses. This initial water-only step is intended to help the graphene surface create sufficient nucleation sites for the metalorganic precursor. Effectively, there is no growth during this initial sequence of water pulses.

After this initiation, alternating pulses of the metal precursor TMA, and DI water with purging times between pulses are sent to the growth chamber. The purging time between alternating precursor pulses is critical to guarantee growth in a controlled ALD mode instead of the potential presence of chemical vapor deposition (CVD) and ALD at the same time.

This latter situation arises when precursor from a previous pulse is still present in the reaction chamber when the next pulse of the other precursor in sent to the chamber. To prevent this, enough purging time between pulses should be allowed.

As noted above, one skilled in the art would readily appreciate that other ALD systems, processes, and recipes also may be used as appropriate within the scope and spirit of the present invention. In general, ALD deposition can be accomplished in a range of temperatures and pulse duration sequences and purging times. The pulse and purging times are very dependent on system design, base pressures, and there is no a unique combination that will work. Instead, there is a range of temperatures, pulses and purging times that can be used to successfully deposit films. We have deposited films using various temperatures from 150-300° C., precursor pulses 0.015-0.045 seconds, and purging times 8-40 seconds. Growth rates depend on the deposition temperature and typical values are between 1.04-1.2 Å per cycle.

The Figures provide AFM and SEM images illustrating aspects of graphene treatment and ALD of high-κ dielectrics on graphene surfaces in accordance with the present invention.

Figure 2A:
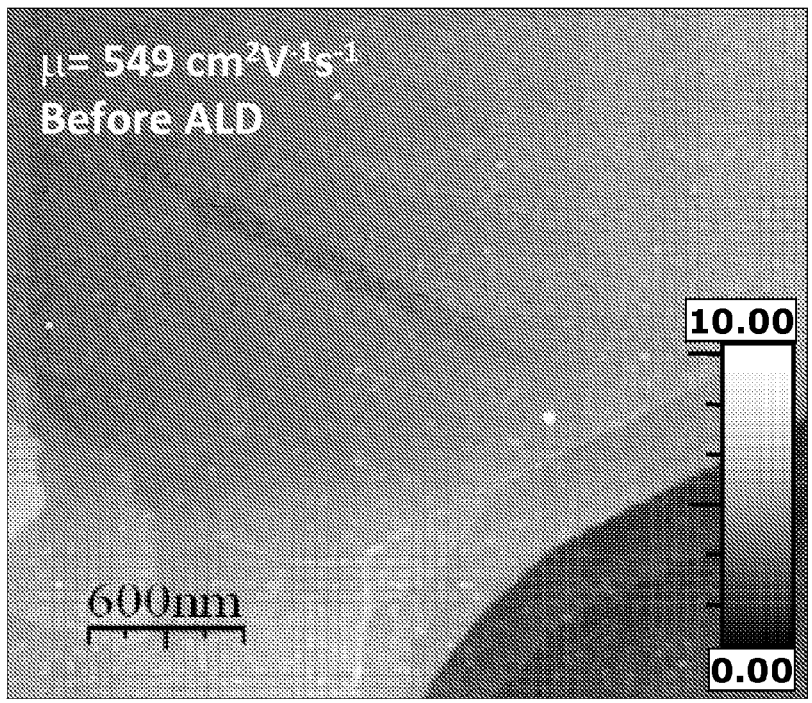
FIGS. 2A-2D illustrate exemplary aspects of a first embodiment of a wet chemistry process for graphene surface preparation in accordance with the present invention.
Figure 2B:
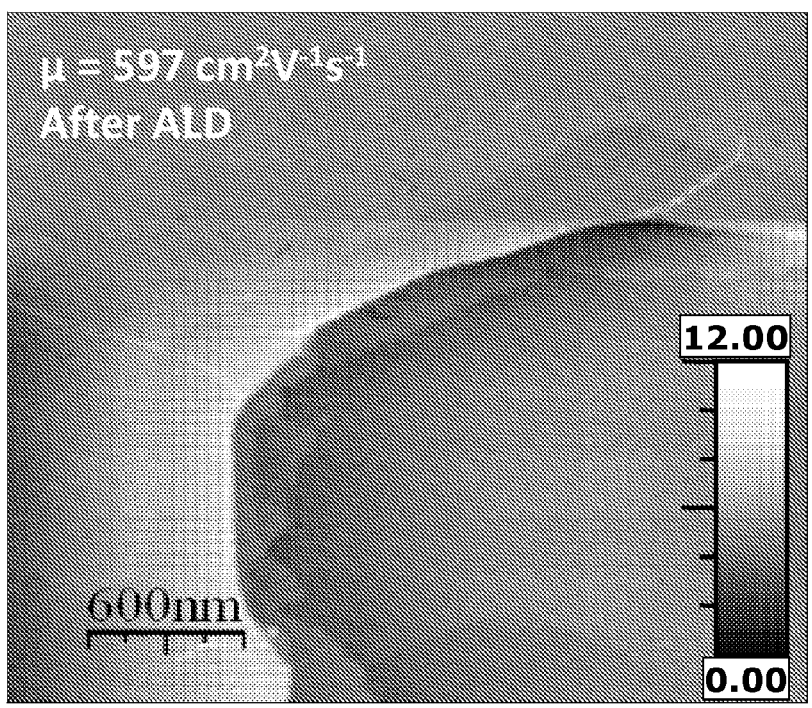
Figure 2C:
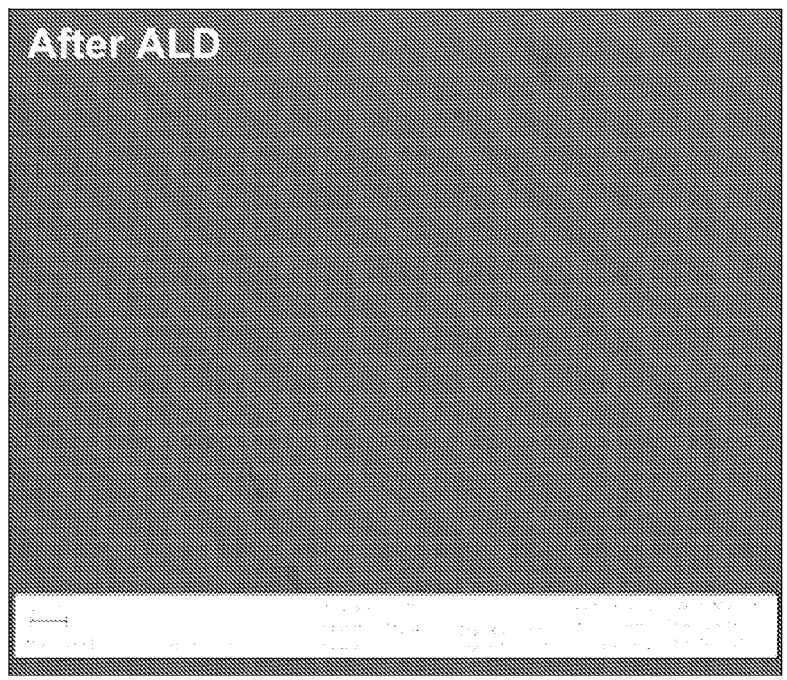
Figure 2D:
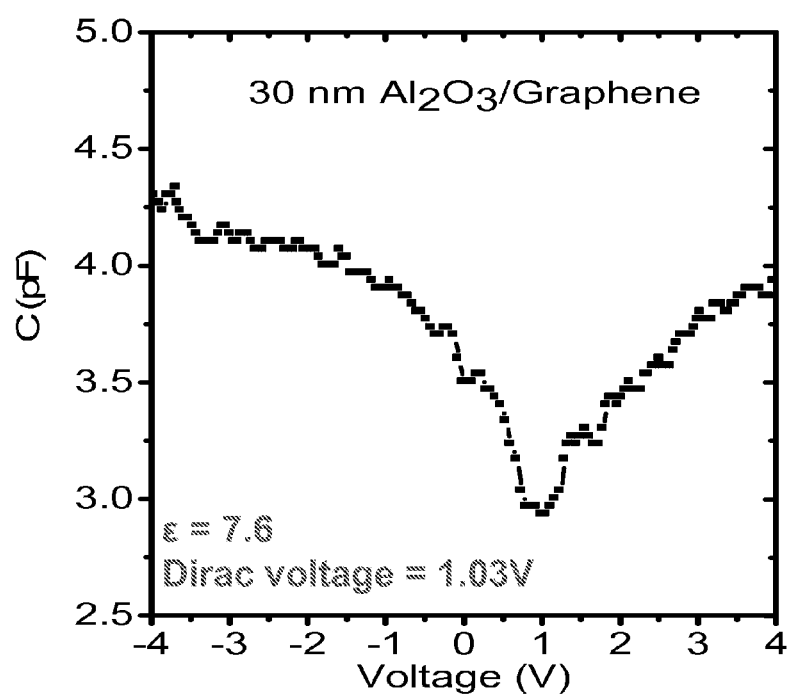

FIGS. 2A-2D, 3A-3D, and 4A-4B illustrate aspects of one or more embodiments of a wet chemistry surface treatment of graphene in accordance with the present invention FIGS. 2A-2D illustrate aspects of a first exemplary EG sample treated using a wet chemistry process in accordance with the present invention. FIG. 2A is an AFM image of an EG sample prior to pretreatment. This EG sample shows the typical morphology of Si-face graphene, which consists of terraces delineated by step bunched edges arising from the underlying SiC substrate. The sample shown in FIG. 2A was then treated in accordance with the present invention. The sample was first pretreated by being soaked ex situ in a 1:1 solution of HF and DI for two minutes at room temperature, followed by a rinse in SC1 for 10 minutes at 80° C. The thus-pretreated sample was then placed in the ALD reactor and was subjected to a single TMA pulse in situ to complete the surface preparation. A 30 nm layer of $Al_2O_3$ was then deposited on the prepared graphene surface via 250 cycles of ALD, and the resulting coated EG sample is shown in FIGS. 2B and 2C. As can be seen in FIGS. 2B and 2C, the deposited $Al_2O_3$ layer is conformal and uniform on the graphene surface. The mobility of the dielectric-coated sample shown in FIG. 2B, $\mu=597$ $cm^2V^{-1}s^{-1}$, is essentially unchanged from the $\mu=549$ $cm^2V^{-1}s^{-1}$ mobility of the uncoated graphene shown in FIG. 2A, thus proving that the electrical properties and structural integrity of the EG were not affected by the pretreatment or the ALD. In addition, as can be seen from the plot shown in FIG. 2D, $\in=7.6$ and the Dirac voltage≈1 V, indicating a high quality oxide with very little deleterious charge within the deposited film.

Figure 3A:
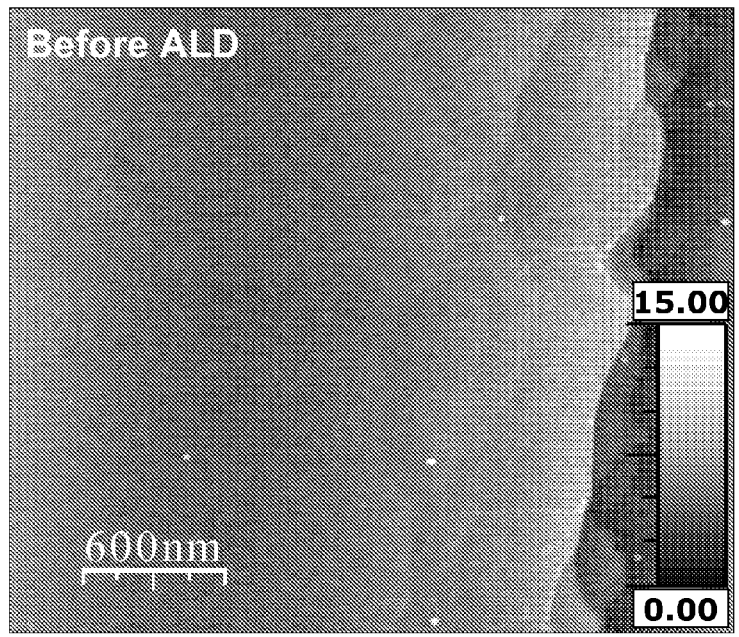
FIGS. 3A-3D illustrate exemplary aspects of a second embodiment of a wet chemistry process for graphene surface preparation in accordance with the present invention.
Figure 3B:
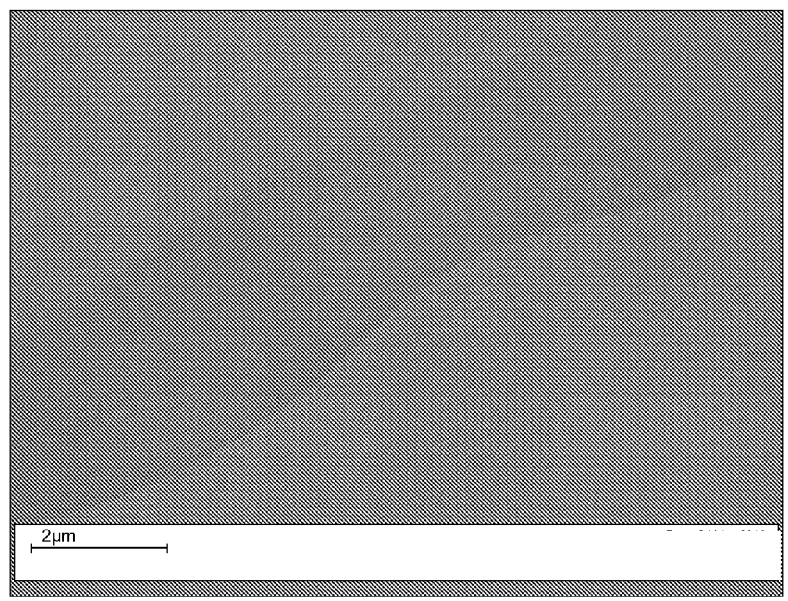
Figure 3C:
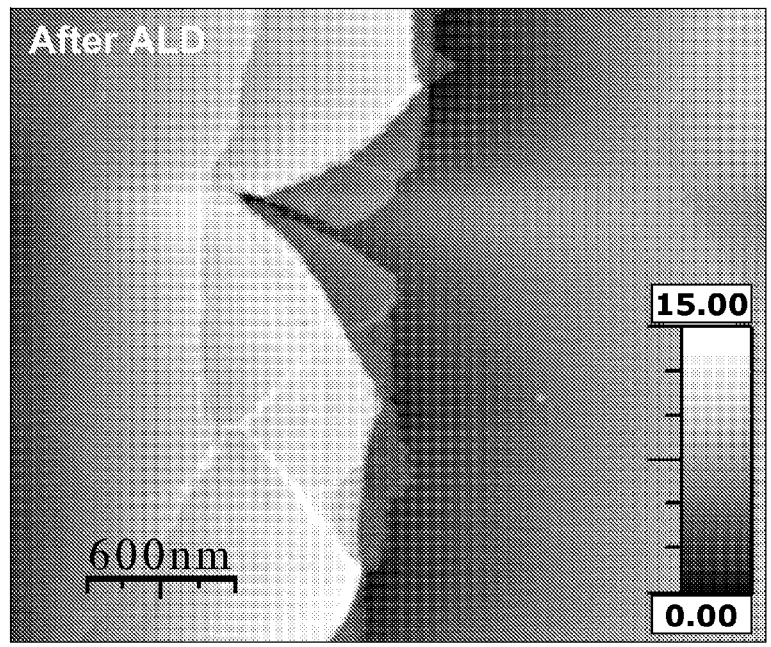
Figure 3D:
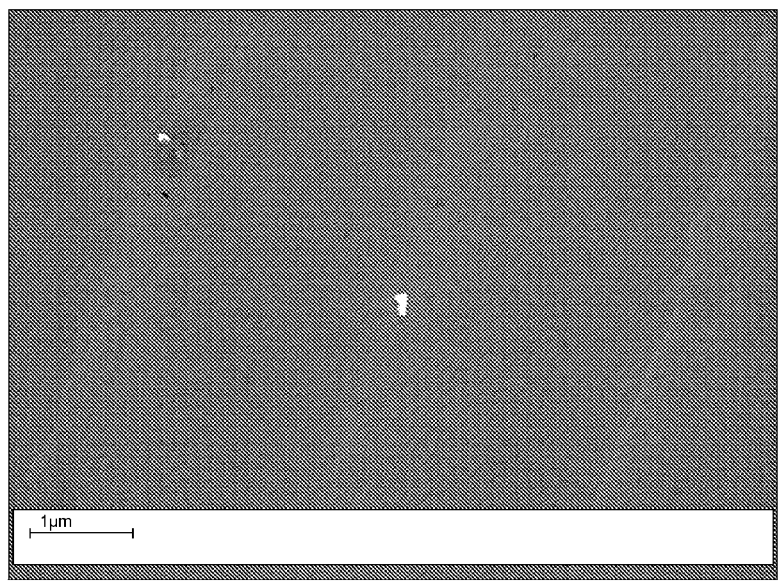

FIGS. 3A-3D illustrate aspects of a second exemplary EG sample treated using a wet chemistry process in accordance with the present invention. FIG. 3A is an AFM image of an EG sample before pretreatment and prior to deposition of an $Al_2O_3$ film by ALD. It shows that the EG morphology is conformal to that of the underlying SiC which exhibits step bunching. The sample shown in FIG. 3B was pretreated by soaking the sample ex situ in a 1:1 solution of HF and DI for two minutes at room temperature, followed by a soaking in SC1 for 10 minutes at 80° C. The thus-pretreated sample was then placed in the ALD reactor and was subjected to ten $H_2O$ pulses in situ to complete the surface preparation in accordance with the present invention. FIG. 3B is an SEM image of the sample prior to ALD, and shows the terraced nature of the graphene surface. A 10 nm layer of $Al_2O_3$ was then deposited on the prepared graphene surface via 90 cycles of ALD. As shown in the AFM image in FIG. 3C, the deposited $AL_2O_3$ layer is uniform and conformal to the graphene surface. This is further illustrated in the large area SEM image shown in FIG. 3D, which shows that the terraces on the graphene surface are uniformly covered, with only a few pinholes on the step edges.

As noted above, whether the in situ surface treatment step is accomplished using one initial TMA pulse or a series of $H_2O$ pulses will depend on the thickness of the dielectric coating to be applied during ALD. Particularly with thinner dielectric films, e.g., films having a thickness of less than 30 nm, the correct in situ nucleation sequence is necessary to achieve good coverage of the graphene surface.

Figure 4A:
FIGS. 4A and 4B illustrate exemplary aspects of the effects of TMA and $H_2O$ in situ treatment in accordance with the present invention.
Figure 4A:
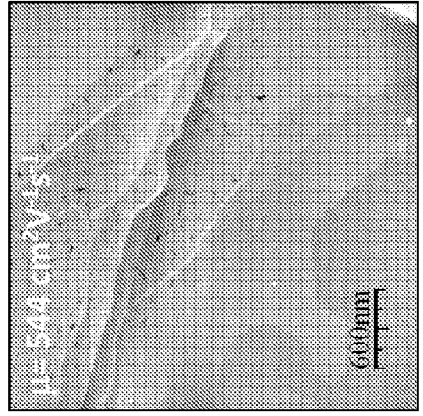
Figure 4B:
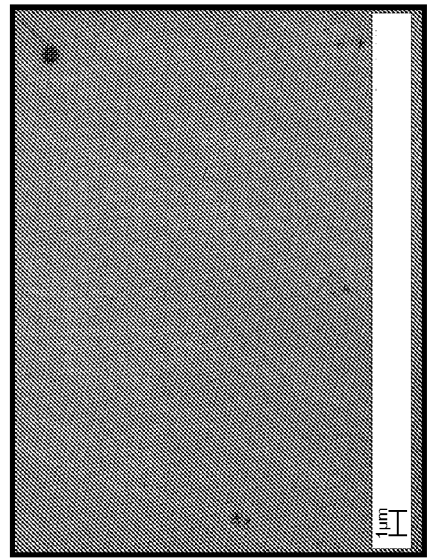
Figure 4B:
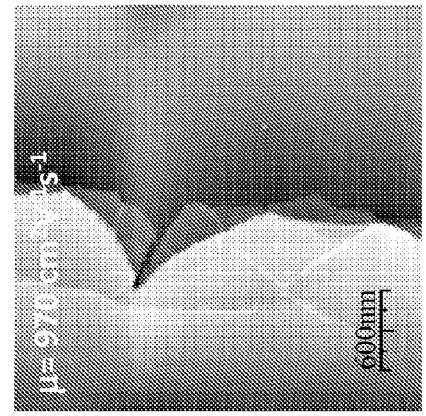

This is illustrated in the AFM and SEM images shown in FIGS. 4A and 4B.

The EG sample shown in FIG. 4A was subjected to a single TMA pulse in the in situ surface preparation step prior to deposition of a 10 nm $Al_2O_3$ film, while the sample shown in FIG. 4B was subjected to 10 $H_2O$ in situ pulses prior to deposition. Although the mobility shown for the single TMA pulse increased, from $\mu=226$ $cm^2V^{-1}s^{-1}$ to $\mu=544$ $cm^2V^{-1}s^{-1}$, as can be seen, the surface of the coated sample is non-uniform, exhibiting numerous pits on the surface.

In contrast, the coated surface shown in FIG. 4B, i.e., the sample subjected to 10 in situ $H_2O$ pulses before deposition of the 10 nm $Al_2O_3$ film, is highly uniform and shows good conformal coating of the surface. Although the mobility in this case decreased slightly, from $\mu=1115$ $cm^2V^{-1}s^{-1}$ before deposition to $\mu=970$ $cm^2V^{-1}s^{-1}$ after, this decrease is considered to be close to the noise limit and does not contradict the conclusion that the $H_2O$ pulse sequence is superior to the TMA pulse when the film to be deposited is thin.

Figure 5:
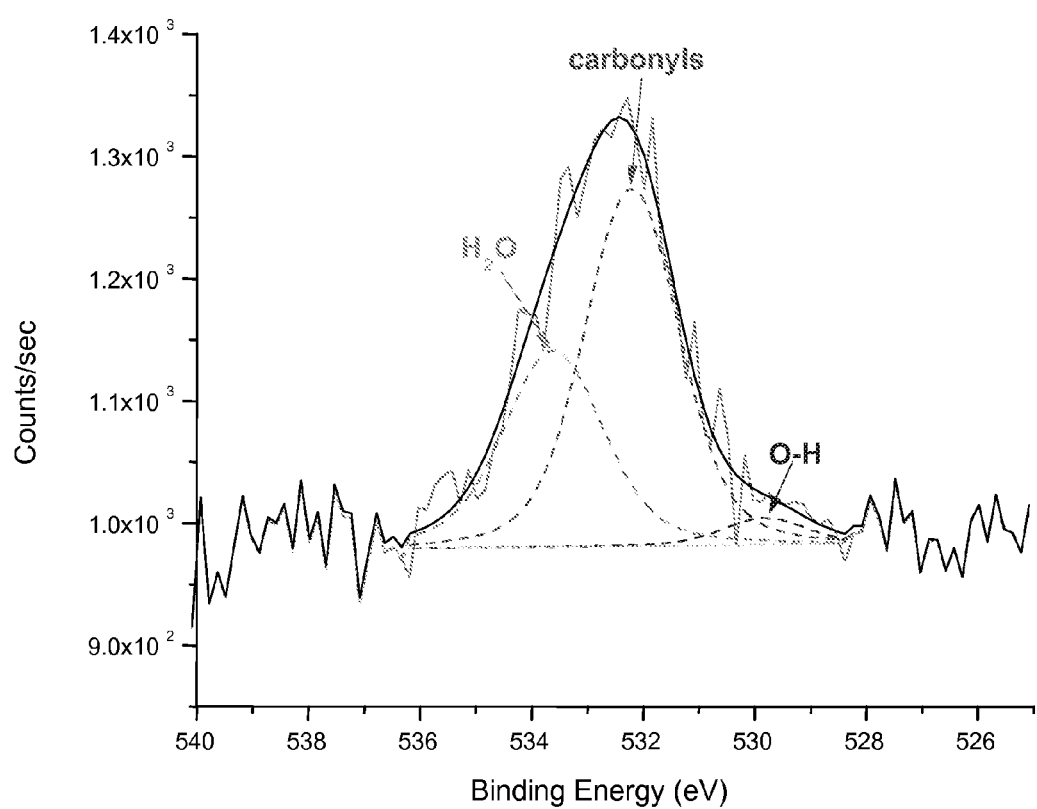
FIG. 5 is a plot illustrating additional aspects of a wet chemistry process for graphene surface preparation in accordance with the present invention.

FIG. 5 illustrates additional aspects of an EG sample treated using a wet chemistry process in accordance with the present invention. This Figure shows the x-ray photoelectron spectroscopy (XPS) results of the O 1s peak after treatment with an SC1 solution. The O 1s spectra has a slight asymmetry and can be fitted with three different lines. One of the deconvoluted peaks is located at 530 eV and corresponds to hydroxyl bonding on the graphene surface. This result is direct proof that the SC1 treatment helps promote the formation of OH bonds necessary for initiating the ALD process.

FIGS. 6A-6D, 7A-7D, 8, and 9A-9B illustrate aspects of one or more embodiments of a dry chemistry surface treatment of graphene in accordance with the present invention.

FIGS. 6A-6D illustrate aspects of a first exemplary EG sample treated using a dry chemistry process in accordance with the present invention.

Figure 6A:
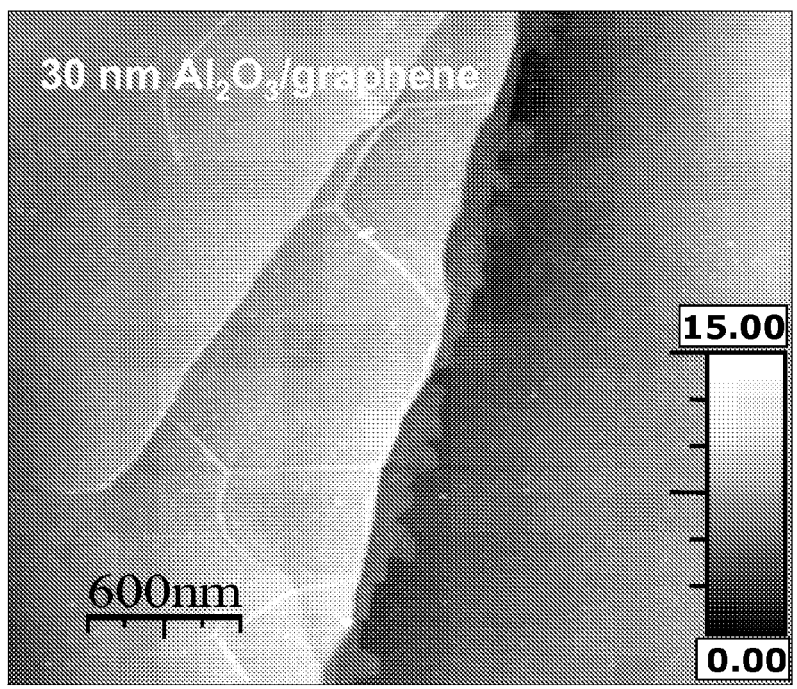
FIGS. 6A-6D illustrate exemplary aspects of a first embodiment of a dry chemistry process for graphene surface preparation in accordance with the present invention.

FIG. 6A is an AFM image of an Si-face EG sample with a 30 nm layer of $Al_2O_3$ deposited thereon by means of 250 cycles of ALD. The surface of the EG sample had been pretreated ex situ by 120 seconds of exposure to $XeF_2$ and in situ with a single TMA pulse prior to ALD of the $Al_2O_3$ dielectric. As can be seen from the AFM image shown in FIG. 6A, the $Al_2O_3$ layer is smooth and conformal and exhibits no visible pinholes in the dielectric layer.

Figure 6B:
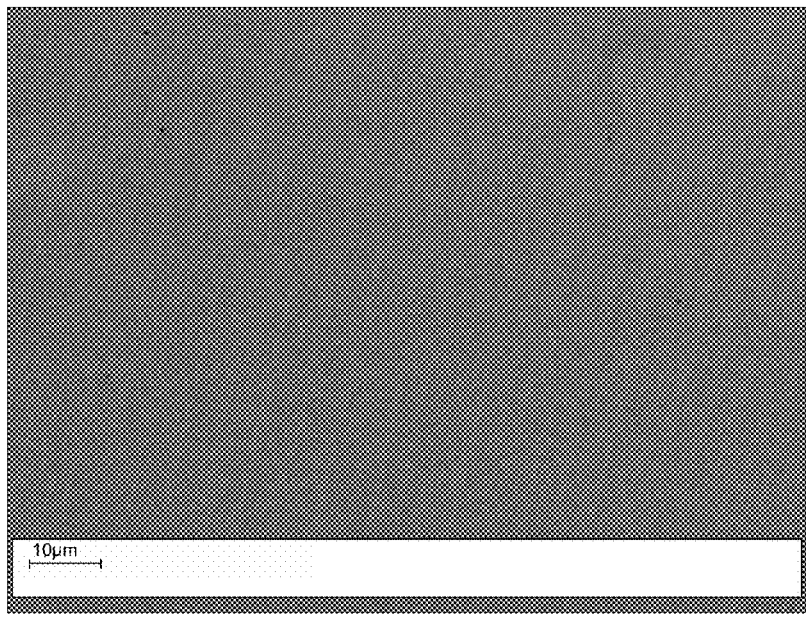
Figure 6C:
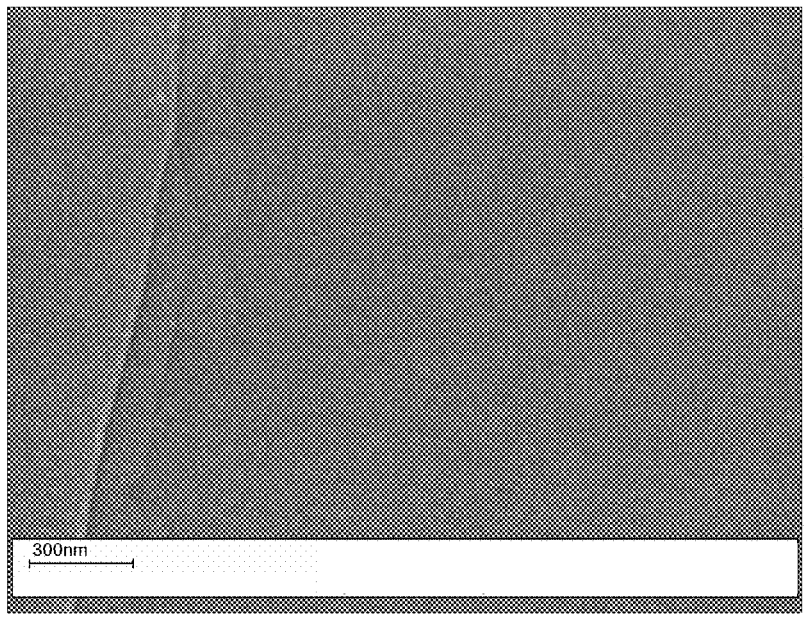

FIG. 6B is an SEM image of the coated EG sample at low magnification and shows a smooth, uniform $Al_2O_3$ film on the surface. FIG. 6C is an SEM image of the sample shown in FIG. 6B at high magnification, and shows that the $Al_2O_3$ film is smooth and uniform across the step edge. The mobility exhibited by the EG sample before deposition of the $Al_2O_3$ was $\mu=769$ $cm^2V^{-1}s^{-1}$. After deposition on the surface prepared in accordance with the present invention, the mobility actually increased, to $\mu=1010$ $cm^2V^{-1}s^{-1}$. This increase in mobility, though small, implies that neither the surface pretreatment nor the dielectric deposition had a negative effect on the graphene lattice. Additionally, the slight mobility increase suggests that there is a compensation and/or screening of some of the graphene doping by either the $XeF_2$ or the ALD or both.

Figure 6D:
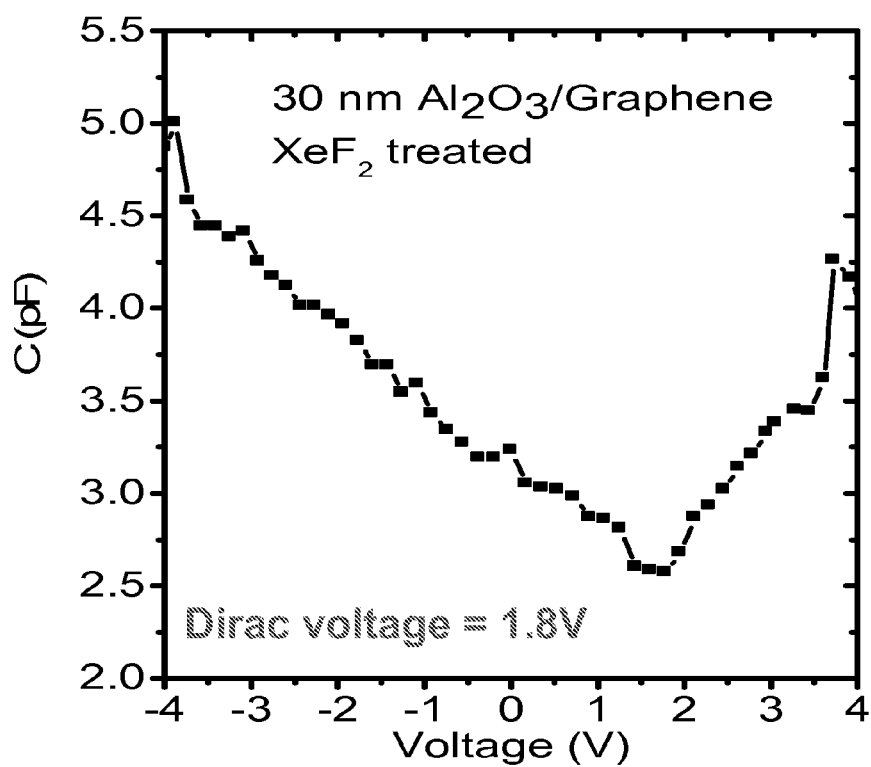

In addition, as shown by the plot in FIG. 6D, the Dirac voltage of the coated EG sample was 1.8 V. Theoretical investigations on metal-oxide-graphene capacitance predict that even without any source doping, the Dirac voltage can be non-zero, solely due to the relative band offsets of the metal to oxide and semiconductor/graphene to oxide. Also, charges in the substrate, oxide, or at the graphene-substrate/graphene-oxide interface can result in a shift of the Dirac voltage. Thus, the C—V measurements imply a relatively low charge density in the $Al_2O_3$.

FIGS. 7A-7D illustrate aspects of a second exemplary EG sample treated using a dry chemistry process in accordance with the present invention.

Figure 7A:
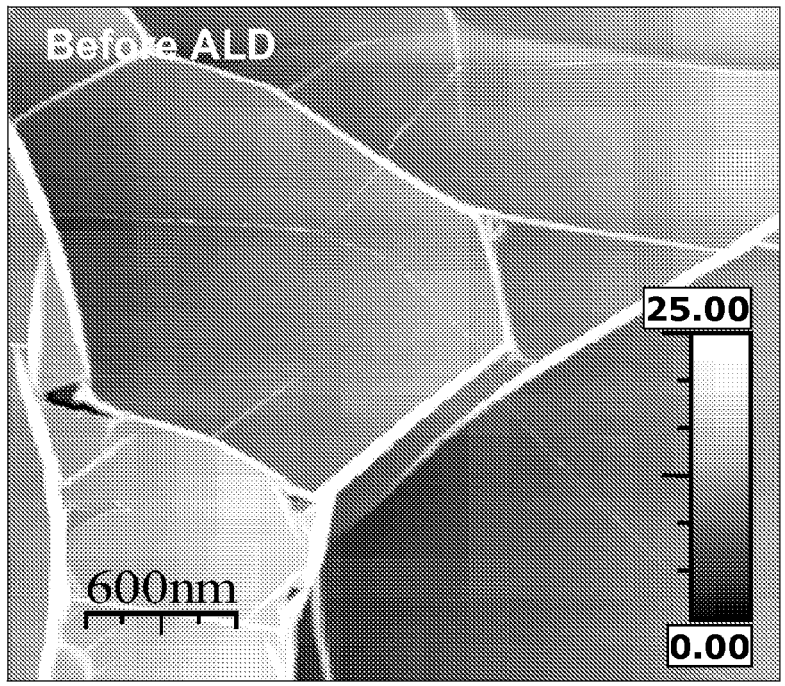
FIGS. 7A-7D illustrate exemplary aspects of a second embodiment of a dry chemistry process for graphene surface preparation in accordance with the present invention.

FIG. 7A is an AFM image of a C-face EG sample that has been treated ex situ by 120 seconds of exposure to $XeF_2$, but prior to in situ treatment by a single TMA pulse, and shows the stepped nature of the graphene surface. Since EG grown on the C-face is much thicker, there are ridges (often hexagonal in nature) that result across the surface to reduce stresses during graphene formation.

Figure 7B:
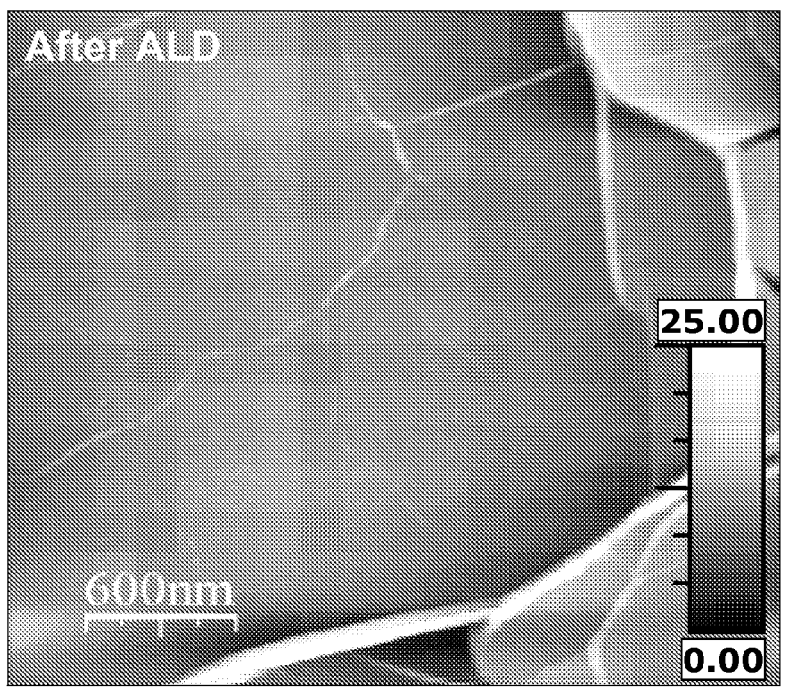

FIG. 7B is an AFM image of the EG sample with 30 nm of $Al_2O_3$ deposited thereon by 250 cycles of ALD. As can be seen in FIG. 7B, the deposited dielectric layer is smooth and uniform, conformally covering the surface of the graphene.

Figure 7C:
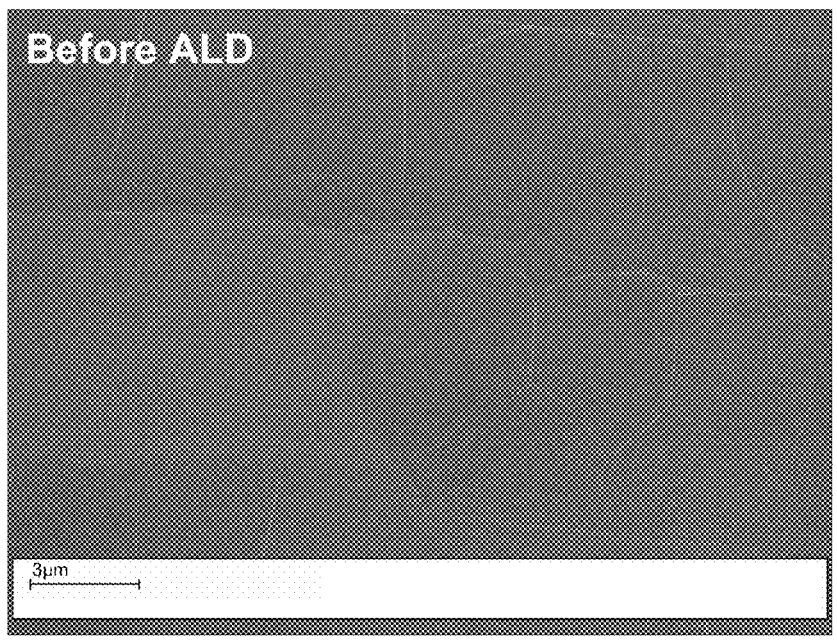
Figure 7D:
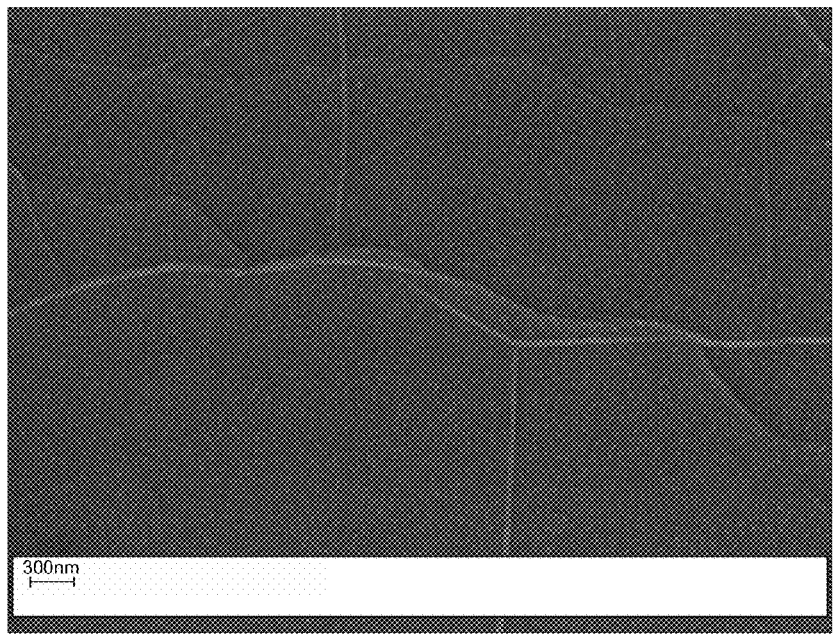

This is further illustrated in the SEM images shown in FIGS. 7C and 7D, which show no pinholes in the deposited dielectric surface (FIG. 7C) and show an even deposition of $Al_2O_3$ everywhere on the surface (FIG. 7D). The present invention provides the first process for depositing a high-κ dielectric such as $Al_2O_3$ on C-face epitaxial graphene in such a smooth and conformal manner.

Figure 8:
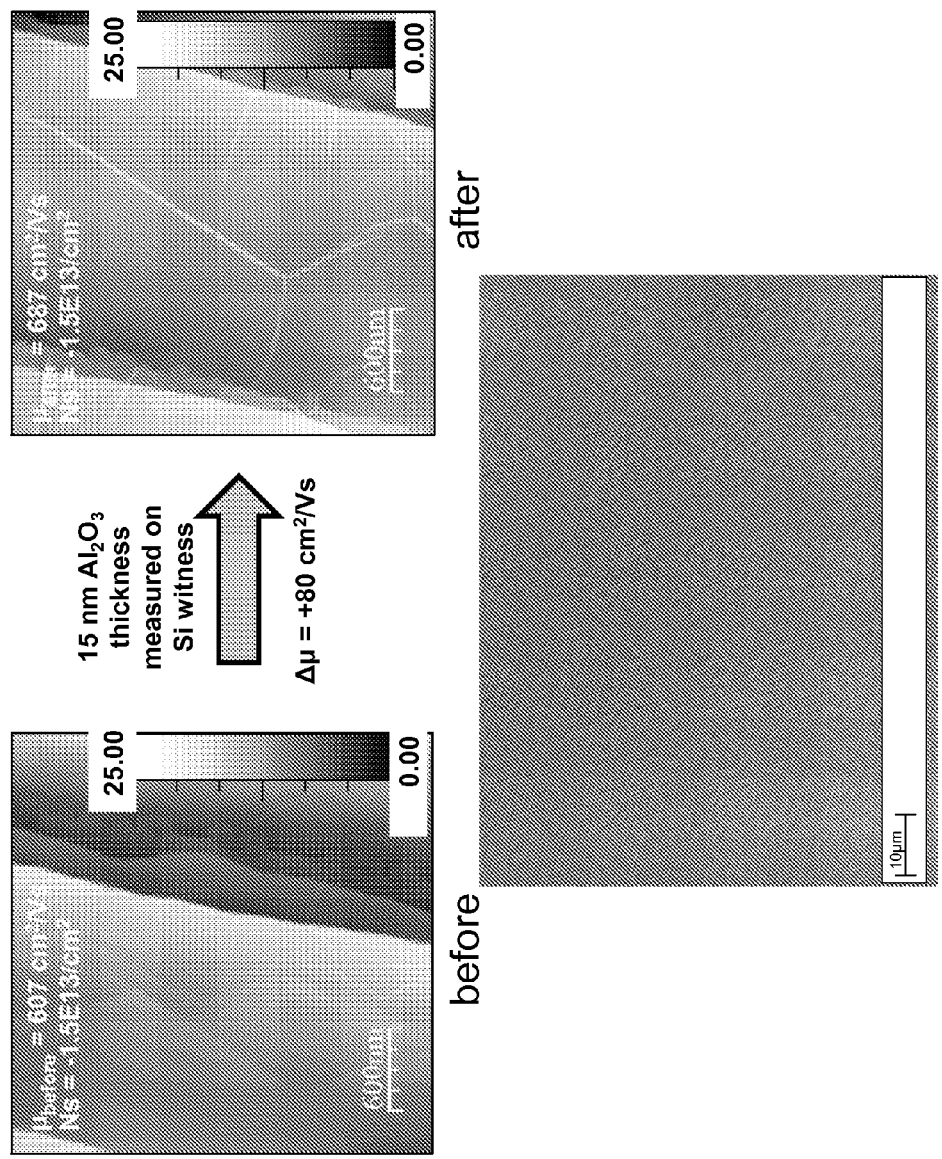
FIG. 8 illustrates additional aspects of a dry chemistry process for graphene surface preparation in accordance with the present invention.

FIG. 8 illustrates additional aspects of dry chemistry graphene surface treatment in accordance with the present invention.

FIG. 8 contains AFM images of an EG sample before and after surface treatment and ALD deposition. Before surface treatment and ALD, the sample exhibited a mobility $\mu_{before}=607$ $cm^2V^{-1}s^{-1}$. The surface was treated by exposure to $XeF_2$ in accordance with the dry chemistry surface treatment described above and a 15 nm layer of $Al_2O_3$ was deposited by ALD, starting with 20 $H_2O$ pulses to complete the surface treatment. The mobility after dielectric deposition was $\mu_{after}=687$ $cm^2V^{-1}s^{-1}$, an increase in mobility $\Delta\mu=80$ $cm^2V^{-1}s^{-1}$. In addition, no pits are seen in either the small scale AFM image or the large scale SEM image shown in FIG. 8.

Figure 9A:
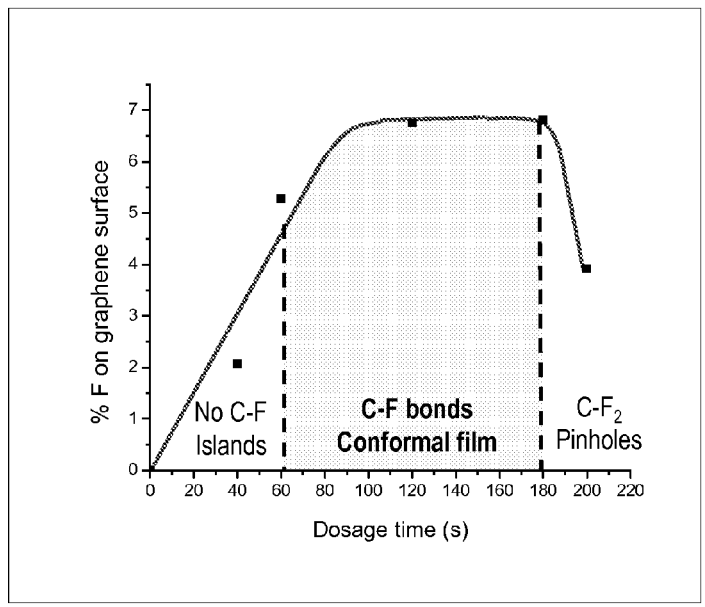
FIGS. 9A and 9B are plots illustrating further aspects of a dry chemistry process for graphene surface preparation in accordance with the present invention.
Figure 9B:
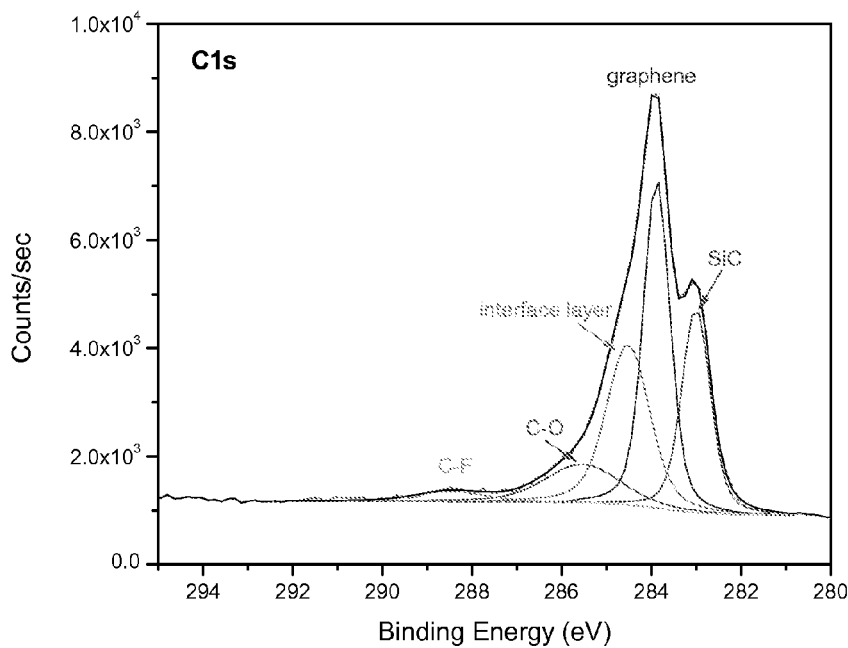

FIGS. 9A and 9B further illustrate aspects of dielectric-coated graphene whose surface was pretreated using a dry chemistry process in accordance with the present invention.

FIG. 9A shows the fluorine surface coverage as a function of $XeF_2$ dosage time. For dosage times less than 60 seconds, no C—F bonds are formed during the $XeF_2$ exposure and the fluorine is simply adsorbed to the graphene surface. Deposition of oxides on such surfaces leads to discontinuous growth in the form of "islands". For $XeF_2$ dosage times between 60-180 seconds (see shadow area of FIG. 9A), C—F bonds are formed, and these C—F bonds are nucleation sites for the ALD oxides. The films deposited on such surfaces are continuous and uniform. For dosage times exceeding 180 seconds, $C-F_2$ bonds begin to form, which lead to discontinuous films with pinholes at the step edges.

FIG. 9B shows an XPS scan taken on a graphene surface after fluorination in the optimal time regime (120 s). The data can be deconvoluted and fitted with five different curves corresponding to graphene (C—C), C—Si, graphene interfacial layer, C—O, and C—F bonds. As noted above, C—F bonds must be present in order to provide reaction sites needed to initiate ALD, and their presence is confirmed by the plot shown in FIG. 9B.

Advantages and New Features:

The epitaxial graphene surface preparation involves a simple wet chemistry approach that can be easily implemented in any semiconductor laboratory, university and clean room facility. The equipment and chemicals involved are readily available and easy to handle. The entire surface preparation process takes less than 30 minutes and size limitations are only imposed by laboratory capabilities. The cleaning process does not damage the underlying graphene layer, thus having no impact on its electrical properties as measured by mobility. ALD films ~250 Å thick deposited on graphene-cleaned surfaces using our approach have greater than 99% coverage. For thinner films the surface coverage is slightly less.

An important feature in the wet chemistry surface treatment process in accordance with the present invention is the use of a very aggressive solution such as a concentrated HF solution to remove any oxide or oxide compounds from the graphene surface. This step limits its use to samples that have not been processed, i.e., do not have metallic contacts or other oxides which might be attacked by the acid. The warm SC1 solution is also a new feature that renders the pristine graphene surface rich in hydroxyl groups (O—H) necessary for initiation of oxide growth. The SC1 also affects poorly deposited/healed metal contacts, peeling them off the surface, thus destroying patterned devices. In order to successfully use our cleaning process, any device fabrication should come last, i.e., after the oxide has been deposited. This is not uncommon in lithographic/device fabrication, where part of the oxide is etched with successive deposition of the metal contacts. See e.g., J. C. Sarace, R. E. Kerwin, D. L. Klein, R. Edwards. *Sol. State Elec.* 11 (1968) 653-660; and Uttam Singisetti, Mark A. Wistey, Gregory J. Burek, Erdem Arkun, Ashish K. Baraskar, Yanning Sun, Edward W. Kiewra, Brian J. Thibeault, Arthur C. Gossard, Chris J. Palmstrom, and Mark J. W. Rodwell, *Phys. Status Solidi C* 6, No. 6, 1394-1398 (2009)/DOI 10.1002/pssc.200881532.

An important new feature of the dry chemistry surface treatment process in accordance with the present invention is the use of $XeF_2$ to functionalize the graphene surface with fluorine atoms that can act as reactions sites for ALD. Under optimum conditions this also does not affect the underlying graphene electrical properties. Films with a thickness of 15 nm have been shown to have greater than 99% coverage, and thinner films are expected to have similar results. Previously fluorination of graphene surfaces only used to create a resistive film and open a large band gap not useful for FET applications.

Alternatives:

The graphene surface preparation involves two basic steps; the ex-situ wet/dry chemistry surface conditioning, and the in-situ sequence of pulses used in the ALD. Various approaches for both the wet chemistry and dry chemistry and for the in-situ portion of the preparation are possible.

In our wet chemistry preparation, we normally use HF:DI at a 1:1 concentration for 2 minutes to expose our graphene surfaces, but concentrations other than 1:1 are possible, as well as longer or shorter exposure times.

Other possible functionalization methods or approaches that could be used to achieve a favorable graphene termination for ALD initiation include:
- immersion of EG sample in diluted piranha ($H_2SO_4$: $H_2O_2$);
- immersion of EG sample in nitric acid ($HNO_3$:DI), heated or room temperature;
- immersion of EG sample in Potassium or sodium nitrate ($KNO_3$, $NaNO_3$); and
- exposure of EG sample to an oxygen plasma or HCl gas.

Such methods can be used with or without the HF treatment of the EG sample.

The usual SC1 concentration used in accordance with the present invention is (1:1:5) and the exposure time is 10 minutes, but other concentrations and exposure times are also possible. In addition, instead of SC1, the washed EG sample can be rinsed in other solutions, such as a solution of HCl alone or in combination with SC1.

Temperatures above room temperature may also enhance the termination effect. Exposure times may vary in order to achieve a usable surface preparation. Different SC1 concentrations and exposure times are possible.

The ex-situ dry chemistry step we use involves a low-temperature treatment with $XeF_2$, this fluorination step can be replaced by a chlorination step instead, where C—Cl— bonds are created. In such cases, the chlorine source can be, for example, $Cl_2$ or $BCl_3$. This might result in a softer surface more prone to oxide formation during ALD.

In addition, a combination of dry and wet chemical treatments could be implemented in order to yield a more reactive surface for ALD. For instance, fluorine-terminated surface ($XeF_2$ treated) could be more susceptible to OH-termination induced by an SC1 treatment, which should render more ALD nucleation sites.

During the ALD surface initiation, 10-20 water pulses is usually used, but more or less water pulses are also possible to successfully accomplish the deposition.

Also, various water precursors for the initial $H_2O$ pulses are possible, for instance, DI, triply distilled $H_2O$, etc.

A two- or more-step temperature deposition is also possible, where the first few layers of the dielectric serve as nucleation sites and are deposited at a lower temperature, and the subsequent growth cycles are deposited at a higher temperature. There should be a waiting period between the final "seeding" cycle and the first "growth" cycle to allow the system to reach the desired temperature.

The dielectric uniformity is limited by the step size found in both Si- and C-face epitaxial graphene. Epitaxial graphene with higher than ~100 Å steps cause nucleation problems near the step edges. To overcome this problem, step-free graphene samples could be used to deposit very thin <100 Å dielectrics and test for coverage.

The processes proposed in this invention could be used to initiate a surface such as graphene for other materials growth, such as other semiconductors including GaN or Si.

Thus, the graphene surface preparation processes in accordance with the present invention offer simple, yet reliable ways to alter the graphene bonding without compromising the electrical or structural properties. These processes can be easily performed in any solid state physics laboratory or clean room with readily available materials. As a result of pretreatment in accordance with the present invention, a conformal coating of a high-κ dielectric can be deposited on an EG sample, and the thus-coated graphene can then be used to fabricate electronic devices such as FETs and other devices where modulation of the channel, reduction of impurities, and reduction of leakage currents is important.

Although particular embodiments, aspects, and features have been described and illustrated, it should be noted that the invention described herein is not limited to only those embodiments, aspects, and features, and it should be readily appreciated that modifications may be made by persons skilled in the art. The present application contemplates any and all modifications within the spirit and scope of the underlying invention described and claimed herein, and all such embodiments are within the scope and spirit of the present disclosure.

What is claimed is:

1. A process for functionalizing a surface of an epitaxial graphene sample (EG sample) for atomic layer deposition (ALD) of a dielectric in an ALD reactor, the process comprising:
(1) subjecting the EG sample to an ex situ functionalization step, the ex situ functionalization step comprising exposing the EG sample to a fluorine gas diluted in an inert carrier gas outside the ALD reactor, the fluorine gas forming C—F bonds on the surface of the EG sample capable of nucleation of dielectrics thereon; and
(2) subjecting the EG sample having C—F bonds thereon to an in situ treatment cycle to complete the surface functionalization, the in situ treatment cycle comprising a plurality of $H_2O$ pulses inside the ALD reactor, wherein each of the plurality of $H_2O$ pulses is separated only by a corresponding purge step;
wherein the functionalized surface of the EG sample is configured for the deposition of a smooth and conformal dielectric layer thereon.

2. The process according to claim 1, wherein the fluorine gas is $XeF_2$.

3. The process according to claim 2, wherein the partial pressure of the $XeF_2$ is about 0.8 Torr and the partial pressure of the carrier gas is about 35 Torr.

4. The process according to claim 1, wherein the EG sample is exposed to the fluorine gas in a pulsed mode.

5. The process according to claim 4, wherein the EG sample is exposed to the fluorine gas in a series of 6 pulses of 20 seconds each.

6. The process according to claim 1, wherein the EG sample is exposed to the fluorine gas in a continuous mode.

7. The process according to claim 6, wherein the EG sample is exposed to the fluorine gas in a continuous mode for greater than 120 seconds at 10 standard cubic centimeters per minute active gas flow.

8. The process according to claim 1, wherein the EG sample is an Si-face epitaxially grown graphene sample.

9. The process according to claim 1, wherein the EG sample is a C-face epitaxially grown graphene sample.

10. A process for functionalizing a surface of an epitaxial graphene sample (EG sample) for atomic layer deposition (ALD) of a dielectric in an ALD reactor, the process comprising:
(1) subjecting the EG sample to an ex situ functionalization step, the ex situ functionalization step comprising exposing the EG sample to a chlorine gas diluted in an inert carrier gas outside the ALD reactor, the fluorine gas forming C—Cl— bonds on the surface of the EG sample capable of nucleation of dielectrics thereon; and
(2) subjecting the EG sample having C—Cl— bonds thereon to an in situ treatment cycle to complete the surface functionalization, the in situ treatment cycle comprising a plurality of $H_2O$ pulses inside the ALD reactor, wherein each of the plurality of $H_2O$ pulses is separated only by a corresponding purge step;

wherein the functionalized surface of the EG sample is configured for the deposition of a smooth and conformal dielectric layer thereon.

11. The process according to claim 10, wherein the EG sample is an Si-face epitaxially grown graphene sample.

12. The process according to claim 10, wherein the EG sample is a C-face epitaxially grown graphene sample.

* * * * *